(12) United States Patent
Urbanek et al.

(10) Patent No.: US 10,932,377 B2
(45) Date of Patent: Feb. 23, 2021

(54) HOUSING FOR ELECTRICAL COMPONENTS AND METHOD FOR CONNECTING A HOUSING BODY TO A HOUSING COVER

(71) Applicant: CPT Group GMBH, Hannover (DE)

(72) Inventors: Thomas Urbanek, Schwabach (DE); Oier Kaltzakorta, Ondarroa (ES); Marcus Ulherr, Schwarzenbruck (DE)

(73) Assignee: Vitesco Technologies Germany GmbH, Hannover (DE)

( * ) Notice: Subject to any disclaimer, the term of this patent is extended or adjusted under 35 U.S.C. 154(b) by 0 days.

(21) Appl. No.: 16/446,071

(22) Filed: Jun. 19, 2019

(65) Prior Publication Data

US 2019/0306997 A1     Oct. 3, 2019

Related U.S. Application Data

(63) Continuation of application No. PCT/EP2017/082756, filed on Dec. 14, 2017.

(30) Foreign Application Priority Data

Dec. 20, 2016   (DE) .................... 10 2016 225 526.6

(51) Int. Cl.
*H05K 5/00* (2006.01)
*H05K 5/03* (2006.01)
(Continued)

(52) U.S. Cl.
CPC ............. *H05K 5/0052* (2013.01); *H05K 5/03* (2013.01); *H05K 5/04* (2013.01); *H05K 5/0247* (2013.01)

(58) Field of Classification Search
CPC .......... H05K 5/0052; H05K 5/04; H05K 5/03; H05K 5/0247
See application file for complete search history.

(56) References Cited

U.S. PATENT DOCUMENTS 5,546,278 A * 8/1996 Bethurum ............ G06K 19/077
                                                        174/365
10,645,823 B2 * 5/2020 Watanabe ............ H05K 5/0052
(Continued)

FOREIGN PATENT DOCUMENTS

CN      2672731 Y     1/2005
CN      1705430 A    12/2005
(Continued)

OTHER PUBLICATIONS

International Search Report and Written Opinion dated Mar. 28, 2018 from corresponding International Patent Application No. PCT/EP2017/082756.
(Continued)

*Primary Examiner* — Rockshana D Chowdhury

(57) ABSTRACT

The disclosure relates to a housing for electrical components and to a method for connecting a housing body to a housing cover. The housing includes the housing body. The base plate supports components arranged thereon. The housing also includes the housing cover which is fastened to the base plate by way of crimp tabs. The crimp tabs are bent over in such a way that the housing cover is interlockingly connected to the housing body. The disclosure also relates a method for connecting the housing to the housing cover. An edge region of the base plate projects beyond the contact surface of the housing body, where crimp tabs that have been bent over lie against the contact surface. Some of the crimp tabs may be designed as extended crimp tabs that partially extend around horizontal body surfaces of the housing body, which lies on the base plate.

12 Claims, 2 Drawing Sheets

(51) Int. Cl.
*H05K 5/04* (2006.01)
*H05K 5/02* (2006.01)

(56) References Cited

U.S. PATENT DOCUMENTS

| | | | |
|---|---|---|---|
| 2005/0263529 A1 | 12/2005 | Fukumoto et al. | |
| 2014/0065877 A1* | 3/2014 | Ohhashi | H05K 5/0052 |
| | | | 439/519 |
| 2014/0339939 A1 | 11/2014 | Batzner | |
| 2015/0373867 A1 | 12/2015 | Ochoa Reyes et al. | |
| 2016/0254612 A1* | 9/2016 | Andrei | H05K 5/0004 |
| | | | 439/701 |

FOREIGN PATENT DOCUMENTS

| | | | |
|---|---|---|---|
| CN | 203055705 U | 7/2013 | |
| DE | 8105788 U1 | 8/1982 | |
| DE | 202008013766 U1 | 2/2009 | |
| DE | 102008053468 B3 * | 1/2010 | ........... H05K 5/0052 |
| DE | 102008053468 B3 | 4/2010 | |
| DE | 102011086896 A1 | 5/2013 | |
| DE | 102013221656 A1 | 4/2015 | |
| DE | 102014215047 A1 | 2/2016 | |
| EP | 1603377 A2 | 12/2005 | |
| EP | 1995121 A1 | 11/2008 | |
| JP | 2001337742 A | 12/2001 | |
| JP | 2005340700 A | 12/2005 | |
| JP | 2011103445 A | 5/2011 | |
| WO | 2016020265 A1 | 2/2016 | |

OTHER PUBLICATIONS

German Office Action dated Sep. 17, 2017 for corresponding German Patent Application No. 10 2016 225 526.6.
Japanese Notice of Reasons for Refusal drafted on Jun. 23, 2020 for the counterpart Japanese Patent Application No. 2019-533226.
German Office Action dated Apr. 30, 2020 for the counterpart German Patent Application No. 10 2016 225 526.6.
Chinese Office Action dated May 8, 2020 for the counterpart Chinese Patent Application No. 201780071428.7.

* cited by examiner

HOUSING FOR ELECTRICAL COMPONENTS AND METHOD FOR CONNECTING A HOUSING BODY TO A HOUSING COVER

CROSS-REFERENCE TO RELATED APPLICATIONS

This application claims the benefit of International Application PCT/EP2017/082756, filed Dec. 14, 2017, which claims priority to German Application No. 10 2016 225 526.6, filed Dec. 20, 2015. The disclosures of the above applications are incorporated herein by reference.

TECHNICAL FIELD

The disclosure relates to a housing for electrical components and a method for connecting a housing body to a housing cover.

BACKGROUND

In the field of power electronics, electrical and electronic components are housed in a housing which is sealed with a housing cover. Various connection methods may be used for attaching the housing cover with the housing. In some examples, screw and rivet connections are used. Crimp connections may also be used.

An electrical component may include a housing from which a connection pin protrudes. The connection pin is electrically conductively connected to a printed circuit board by way of through-hole technology. That part of the connection pin which protrudes out of the housing is surrounded by an elastic material which is connected to the housing in a fluid-tight manner. It is desirable to improve a housing and. a method of connecting the housing to the housing cover.

SUMMARY

One aspect of the disclosure provides a housing that includes a housing body. The housing body includes a base plate in which components are arranged thereon. In addition, the housing includes a housing cover. Another aspect of the disclosure provides a method for connecting the housing to the housing cover. In some examples, the housing may be a housing of a control electronics system in motor vehicles.

Implementations of the disclosure may include one or more of the following optional features. In some implementations, the housing has a housing body which is fastened to a base plate on which electrical and/or electronic components are arranged. The base plate is connected to a housing cover. The housing cover may be fastened to the base plate by way of crimping lugs which are bent over such that the housing cover is connected to the housing body in an interlocking manner. In this case, an edge region of the base plate projects beyond the support surface of the housing body on which the bent-over crimping lugs are supported.

In some implementations, some of the crimping lugs are designed as elongated crimping lugs. The elongated crimping lugs surround the base plate and vertical surfaces of an additional structural component which is supported on the base plate. In some examples, the ends of the elongated crimping lugs are supported on horizontal body surfaces of the housing body. In some examples, a printed circuit is arranged on the base plate.

In some implementations, the method for connecting a housing for electrical components to a housing cover includes the following steps. After providing a housing which includes a housing body and a base plate, a housing cover is produced. Lateral crimping lugs may be arranged on the housing cover such that they are supported on corresponding planar surfaces of the base plate after a joining process by way of crimping. The housing cover may be fastened to the housing body by plastic deformation of the lateral crimping lugs.

In some implementations, additional elongated crimping lugs are arranged laterally on the housing cover such that they are supported on corresponding planar surfaces of the housing body and/or of a further structural part after a joining process by way of crimping. In some examples, the housing cover is produced by stamping a sheet metal part.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
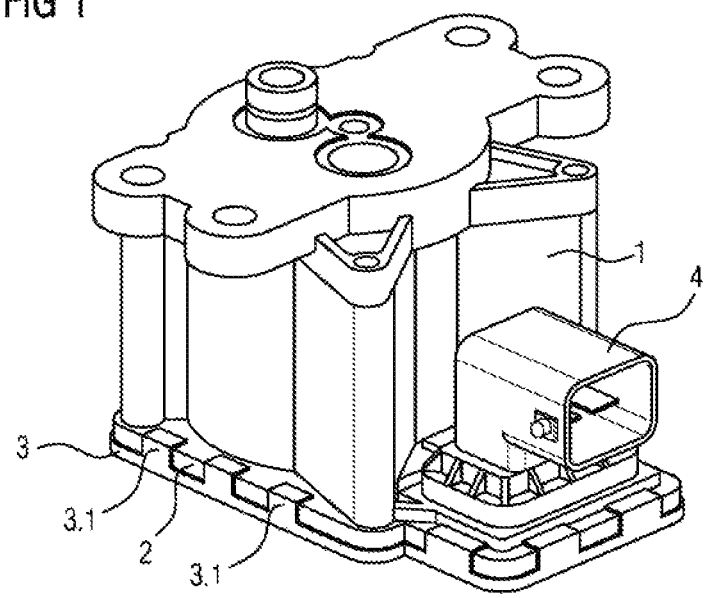
FIG. 1 is a perspective view of an exemplary housing, in which a housing cover is crimped solely to a base plate.

FIG. 1 shows a housing that includes a housing body 1 having a base plate 2. A printed circuit is fitted on the base plate 2 and electrical and/or electronic components are arranged on the base plate 2. The housing cover 3 is located below the base plate 2. Crimping lugs 3.1 are fitted to the outer sides of the housing cover and are plastically deformed such that they surround the base plate 2 and are supported on the top side of the base plate 2. Therefore, the base plate 2 is supported by the housing body 1 by way of a sealed fastening arrangement. In some examples, an additional structural part 4 is fastened on the base plate 2 by way of a separate connection. The additional structural part 4 may serve, for examples, to receive and guide connection lines for the printed circuit. By way of example, a plug arrangement can be accommodated there. In order to allow fastening of the housing cover 3 to the base plate 2 in the region in which the additional structural part 4 is supported on the base plate 2, the base plate 2 includes a projection on which the ends of the bent-over crimping lugs 3.1 are supported.

Figure 2:
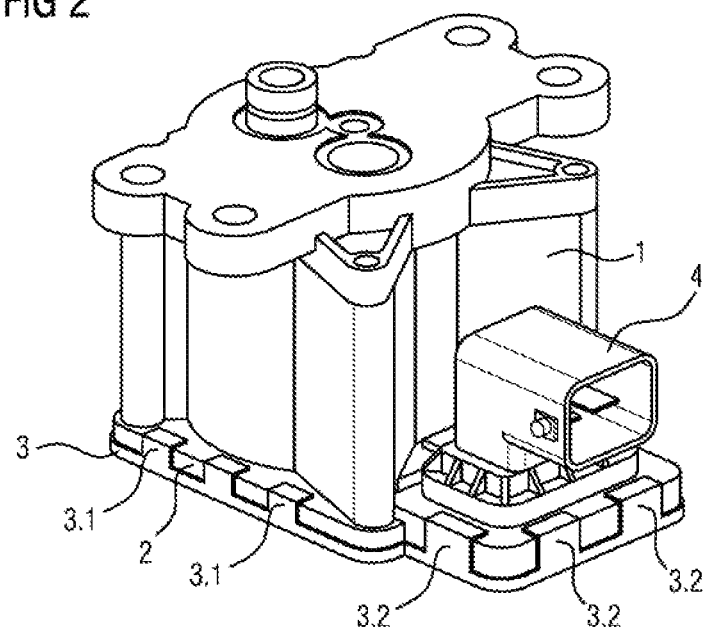
FIG. 2 is a perspective view of an exemplary housing, in which a housing cover is additionally crimped to an additional structural part.

Referring to FIG. 2, the housing cover 3 further includes elongated crimping lugs 3.2 in addition to the crimping lugs 3.1. The housing cover 3 may be jointly fastened to the base plate 2 and to the additional structural part 4 by way of these elongated crimping lugs 3.2. A projection of the base plate 2 is not needed here. Therefore, the size of the entire housing arrangement may be reduced and therefore a reduction in installation space may be rendered possible. In addition, the layout of the printed circuit may be optimized in this way.

Figure 3:
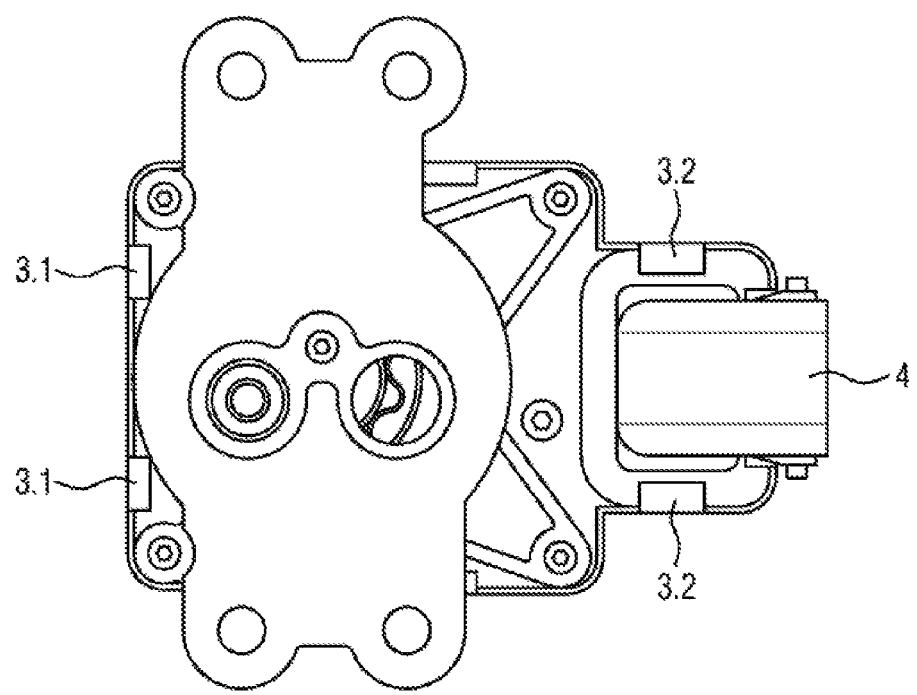
FIG. 3 is a plan view of the exemplary housing shown in FIG. 2.

FIG. 3 shows a plan view of the housing design explained in FIG. 2.

A number of implementations have been described. Nevertheless, it will be understood that various modifications may be made without departing from the spirit and scope of the disclosure. Accordingly, other implementations are within the scope of the following claims.

What is claimed is:

1. A housing for electrical components, the housing comprising:
   a housing body including a base plate in which components are arranged thereon;
   a housing cover fastened to the base plate by way of crimping lugs, the crimping lugs are bent over such that the housing cover is connected to the housing body in an interlocking manner, wherein an edge region of the base plate projects beyond a support surface of the housing body on which bent-over crimping lugs are supported; and
   an additional structural part extending from the housing body and the base plate,
   wherein some of the crimping lugs comprise elongated crimping lugs, the elongated crimping lugs having a length that is greater than a length of the crimping lugs which are not elongated crimping lugs, the elongated crimping lugs partially surround a horizontal body surface of the additional structural part and are bent so as to be supported on the horizontal body surface such that the housing cover is connected to the additional structural part in an interlocking manner,
   wherein the crimping lugs, including the elongated crimping lugs, are arranged on outer sides of and extend from the housing cover,
   wherein the horizontal body surface of the additional structural part is part of a base portion thereof, and
   wherein the additional structural part comprises a plug or socket disposed on the horizontal body surface of the base portion.

2. The housing of claim 1, wherein the base plate includes a printed circuit.

3. The housing of claim 1, wherein the housing cover includes sheet steel.

4. A method for connecting a housing for electrical components to a housing cover, the method comprising:
   providing a housing body for electronic components with a base plate;
   producing a housing cover, a base area of the housing cover corresponds to the base area of the housing body, wherein lateral crimping lugs are arranged on the housing cover such that they are supported on corresponding planar surfaces of the base plate after a joining process by way of crimping;
   providing an additional structural part extending from the housing body and the base plate, wherein some of the lateral crimping lugs comprise elongated crimping lugs, the elongated crimping lugs having a length that is greater than a length of the lateral crimping lugs which are not elongated crimping lugs, the elongated crimping lugs partially surround a horizontal body surface of the additional structural part, and
   fastening the housing cover to the housing body and the additional structural part by plastic deformation of the lateral crimping lugs,
   wherein the crimping lugs, including the elongated crimping lugs, are arranged on outer sides of and extend from the housing cover,
   wherein the horizontal body surface of the additional structural part is part of a base portion thereof, and
   wherein the additional structural part comprises a plug or socket disposed on the horizontal body surface of the base portion.

5. The method of claim 4, wherein the housing cover is produced by stamping a sheet steel part.

6. The housing of claim 2, wherein the additional structural part comprises a plug or socket having connection lines coupled to the printed circuit.

7. The housing of claim 1, wherein the elongated crimping lugs directly contact the horizontal body surface of the base portion of the additional structural part so as to provide a direct connection between the housing cover and the additional structural part, and the base portion of the additional structural part has a thickness that is larger than a thickness of the base plate.

8. The method of claim 4, wherein the base plate includes a printed circuit and the additional structural part comprises a plug or socket having connection lines coupled to the printed circuit.

9. The method of claim 4, wherein following the fastening, the elongated crimping lugs directly contact the horizontal body surface of the base portion of the additional structural part so as to provide a direct connection between the housing cover and the additional structural part, and wherein the base portion of the additional structural part has a thickness that is greater than a thickness of the base plate.

10. The method of claim 9, wherein fastening the housing cover to the housing body and the additional structural part by plastic deformation of the lateral crimping lugs comprises plastically deforming the lateral crimping lugs so that distal end portions of the lateral crimping lugs directly contact the base plate and distal end portions of the elongated crimping plugs directly contact the horizontal body surface of the base portion of the additional structural part.

11. A housing for electrical components, the housing comprising:
    a housing body including a base plate in which components are arranged thereon;
    a housing cover fastened to the base plate by way of crimping lugs, the crimping lugs are bent over such that the housing cover is connected to the housing body in an interlocking manner, wherein an edge region of the base plate projects beyond a support surface of the housing body on which bent-over crimping lugs are supported; and
    an additional structural part extending from the housing body and the base plate,
    wherein some of the crimping lugs comprise elongated crimping lugs, the elongated crimping lugs having a length that is greater than a length of the crimping lugs which are not elongated crimping lugs, the elongated crimping lugs partially surround a horizontal body surface of the additional structural part and are bent so as to be supported on the horizontal body surface such that the housing cover is connected to the additional structural part in an interlocking manner,
    wherein the horizontal body surface of the additional structural part is part of a base portion thereof, the elongated crimping lugs directly contact the horizontal body surface of the base portion of the additional structural part so as to provide a direct connection between the housing cover and the additional structural part, and the base portion of the additional structural part has a thickness that is larger than a thickness of the base plate, and
    wherein the additional structural part comprises a plug or socket disposed on the horizontal body surface of the base portion.

12. The housing of claim 11, wherein the crimping lugs and the elongated crimping lugs are arranged on outer sides of and extend from the housing cover in an axial direction of the housing cover.

\* \* \* \* \*